(12) United States Patent
Kinoshita et al.

(10) Patent No.: US 6,341,063 B2
(45) Date of Patent: Jan. 22, 2002

(54) INSTALLATION STRUCTURE OF PRINTED-CIRCUIT BOARD FOR ELECTRONIC CONTROL UNIT

(75) Inventors: Kenji Kinoshita, Kariya; Hideki Ishihara; Akira Kurimoto, both of Anjo; Haruki Matsuzaki, Kariya; Ryoichi Yamamoto, Handa; Akihiro Yoshida, Aki-gun; Ryouta Nakamura, Kariya; Toshiki Kobayashi, Okazaki; Hajime Katsuro, Nagoya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/770,404

(22) Filed: Jan. 29, 2001

(30) Foreign Application Priority Data

| Feb. 2, 2000 | (JP) | 12-024624 |
| Feb. 8, 2000 | (JP) | 12-029909 |
| Feb. 8, 2000 | (JP) | 12-029910 |
| Dec. 21, 2000 | (JP) | 12-388900 |

(51) Int. Cl.$^7$ .............................................. H05K 7/20
(52) U.S. Cl. ...................... 361/690; 361/715; 361/756; 361/759
(58) Field of Search .................... 174/35 R, 35 GC; 361/690, 694–695, 704, 707, 709–710, 715, 719–720, 725–727, 728, 730, 737, 752, 753, 756, 816, 818

(56) References Cited

U.S. PATENT DOCUMENTS

| 5,003,429 | A | | 3/1991 | Baker et al. | |
| 5,414,592 | A | * | 5/1995 | Stout et al. | 361/704 |
| 5,461,542 | A | | 10/1995 | Kosak et al. | |
| 5,548,481 | A | | 8/1996 | Salisbury et al. | |
| 5,912,803 | A | | 6/1999 | Dahl et al. | |
| 6,101,090 | A | * | 8/2000 | Gates | 361/690 |

* cited by examiner

Primary Examiner—Gregory Thompson
(74) Attorney, Agent, or Firm—Nixon & Vanderhye P.C.

(57) ABSTRACT

A casing of an ECU is formed within an air cleaner of an intake module for an internal combustion engine. The casing faces an intake air passage, and formed in a pocket, so that the casing is easily formed and the water and dust proof performances thereof are improved. A printed-circuit board to which a metal plate is fixed is inserted into the casing along slits formed on an inner wall of the casing. The slits pinch the printed-circuit board and the metal plate at the rear end area thereof. Thus, anti-stress and anti-vibration performances of the printed-circuit board are improved. The metal plate including convexes and concaved contacting portions is easily formed by pressing an aluminum or steel plate. Thus, the metal plate is formed with low cost. Further, the metal plate appropriately includes holes, thereby promoting the heat radiation and reducing the weight thereof.

24 Claims, 10 Drawing Sheets

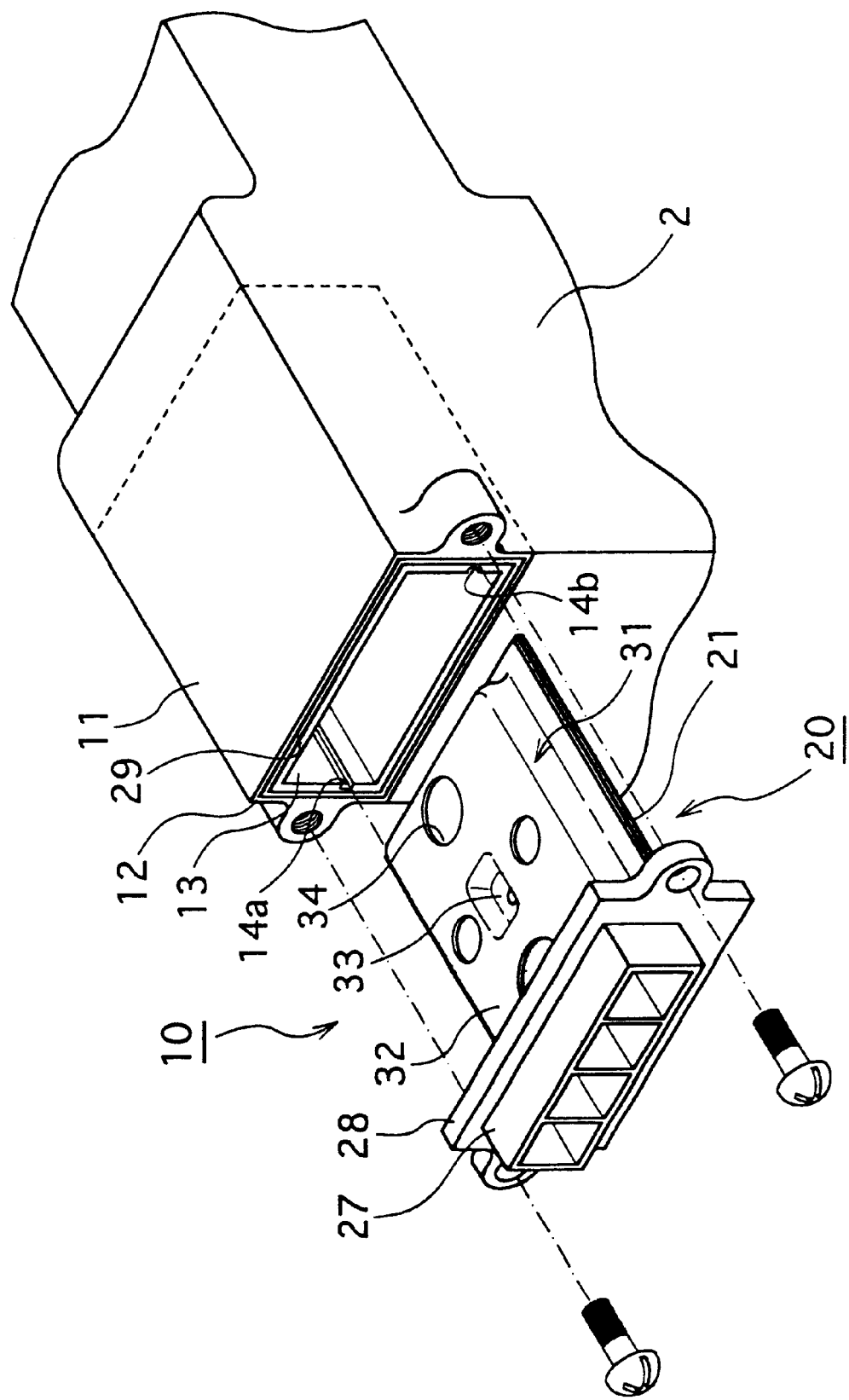

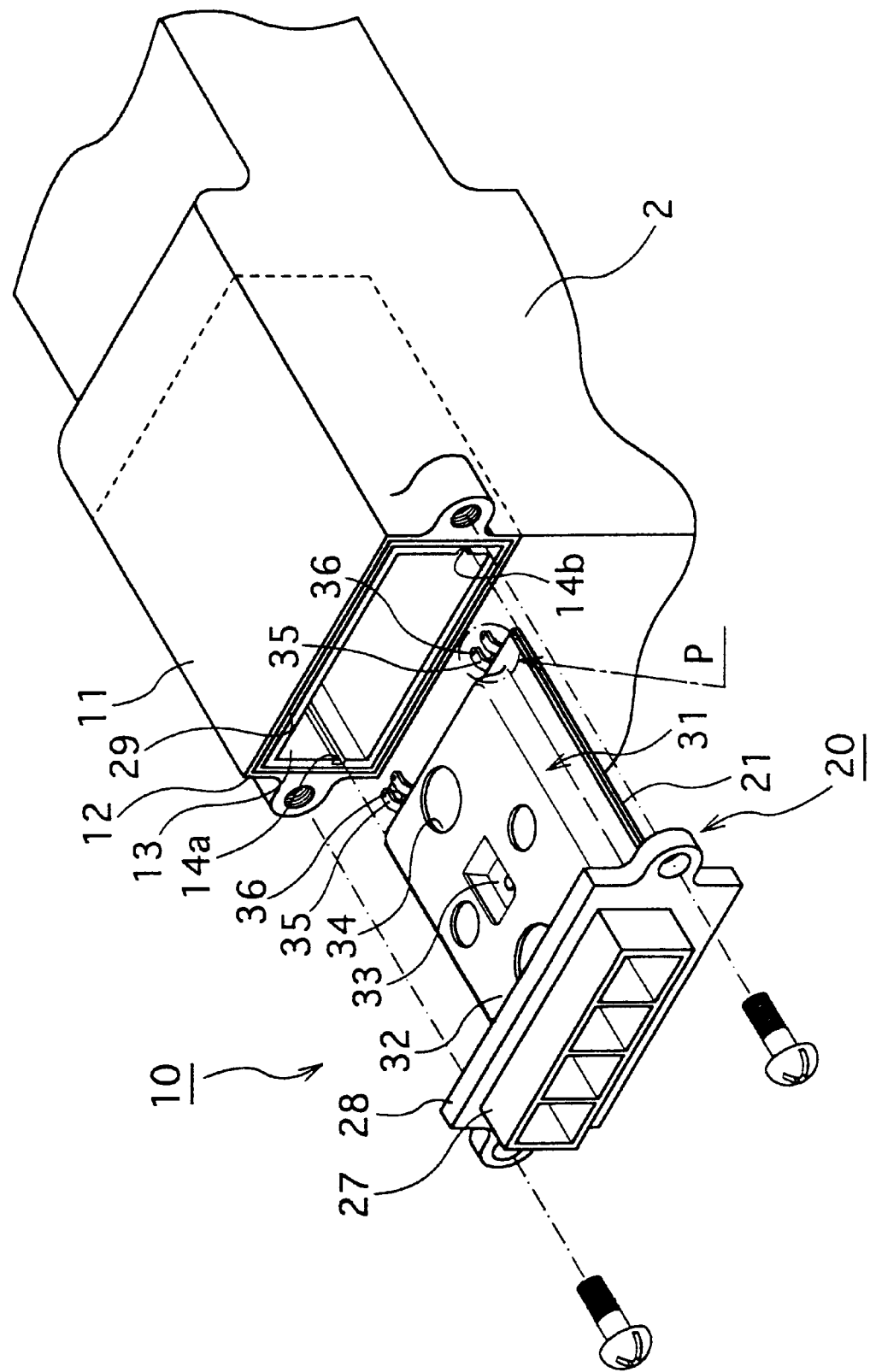

INSTALLATION STRUCTURE OF PRINTED-CIRCUIT BOARD FOR ELECTRONIC CONTROL UNIT

CROSS REFERENCE TO RELATED APPLICATION

This application is based on and incorporates herein by reference Japanese Patent Application Nos. 2000-24624 filed on Feb. 2, 2000, 2000-29909 filed on Feb. 8, 2000, 2000-29910 filed on Feb. 8, 2000, and 2000-388900 filed on Dec. 21, 2000.

BACKGROUND OF THE INVENTION

1. Field of the Invention

The present invention relates to an installation structure of a printed-circuit board on which electronic devices are mounted, suitable for use in an electronic control unit of a vehicle engine.

2. Description of Related Art

An intake module of an internal combustion engine includes sub-modules such as an air cleaner, an intake duct, an air-flow sensor, a throttle body, and an intake manifold. The sub-modules include not only miscellaneous sensors and actuators, but also ECU (Electronic Control Unit), which has been installed in a vehicle cabin so far. Here, housings of the sub-modules are mainly made of resin.

The ECU is installed in a casing within an air cleaner made of resin. Since the casing is influenced by an engine vibration, a printed-circuit board disposed in the ECU is also influenced by the vibration. A resonance of the vibration might cause a vibration ten times as large as the engine vibration in the printed-circuit board. The large vibration worsens the electronic devices mounted on the printed-circuit board, so that the ECU does not work effectively.

SUMMARY OF THE INVENTION

An object of the present invention is to improve anti-stress and anti-vibration performance of an electronic control unit, and to reduce a total weight thereof.

According to a first aspect of the present invention, a printed-circuit board is fixed to a high rigid metal plate at a peripheral end and approximate center portions thereof. The metal plate includes a convex for containing a plurality of electronic devices mounted on a printed-circuit board. The printed-circuit board is contained in a casing. Thus, the resonance frequency of the printed-circuit board increases, and vibration amplitude at the resonance decreases, thereby preventing the electronic devices from being broken.

According to a second aspect of the present invention, the metal plate is fixed to the printed-circuit board at a side where an outside connector is attached to the printed-circuit board, so that a space defined by the printed-circuit board and an inner wall of the casing is set larger than the disposing dimension of the outside connector. Thus, the convex of the metal plate is easily and freely formed even when the shape thereof is complicated.

According to a third aspect of the present invention, an inside of the casing communicates with an intake air passage at some locations of the inner wall, and the metal plate covers the communicating locations for separating the printed-circuit board from the intake air passage. Thus, the metal plate faces the intake air passage, so that heat radiation of the electric devices is improved.

According to a fourth aspect of the present invention, a support member tightly pinches the printed-circuit board and the metal plate at plural peripheral ends thereof. Thus, the heat radiation of the electric devices is improved without worsening a mount efficiency of the printed-circuit board. The metal plate fixed to the printed-circuit board improves the anti-stress and anti-vibration performances of the ECU.

According to a fifth aspect of the present invention, the metal plate is provided on the printed-circuit board at an opposite side of the outside connector. Thus, the convex of the metal plate contains the electronic devices without being influenced by the outside connector, and covers most of the printed-circuit board. Thereby, the shape of metal plate is simplified, and heat radiation thereof is improved.

According to a sixth aspect of the present invention, an elastic plate is provided on the metal plate at an opposite side of the printed-circuit board, and a support member tightly pinching the printed-circuit board and the metal plate at plural peripheral ends thereof while providing the elastic plate between the metal plate and the support member. Thus, heat radiation of the electric devices is improved without worsening a mount efficiency of the printed-circuit board. The metal plate including the elastic plate fixed to the printed-circuit board improves the anti-stress and anti-vibration performances of the ECU.

According to a seventh aspect of the present invention, the printed-circuit board is fixed to the metal plate at four or more peripheral end portions. Thus, the anti-stress and anti-vibration performances of the printed-circuit board are improved.

BRIEF DESCRIPTION OF THE DRAWINGS

Additional objects and advantages of the present invention will be more readily apparent from the following detailed description of preferred embodiments thereof when taken together with the accompanying drawings in which:

FIG. 3 is a perspective view showing a casing and an electronic control circuit installed in the casing (first embodiment);

FIG. 6 is a perspective view showing a casing and an electronic control circuit installed in the casing (first modification of first embodiment);

DETAILED DESCRIPTION OF PREFERRED EMBODIMENTS

First Embodiment

Figure 1:
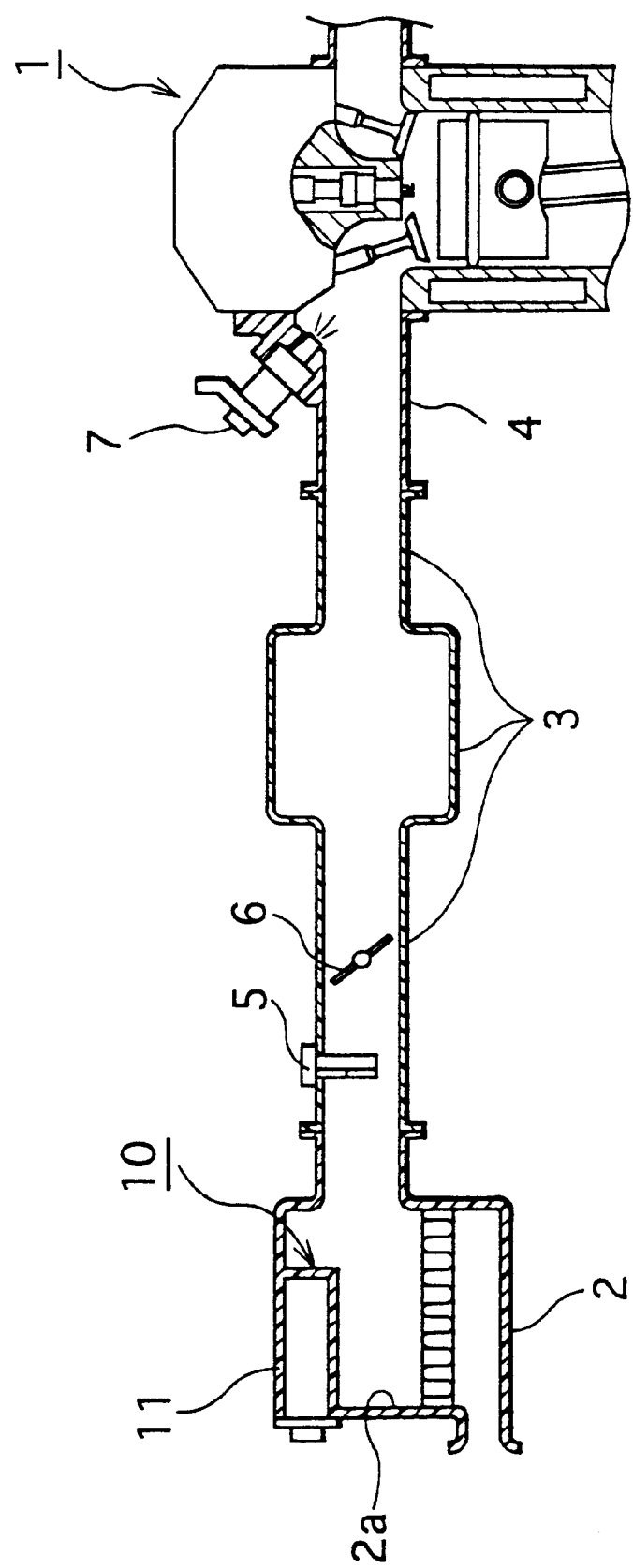
FIG. 1 is a schematic view showing an ECU installed in an intake module for an internal combustion engine.

FIG. 1 is a schematic view showing an ECU (Electronic Control Unit) 10 installed into an air cleaner 2 of an intake module for an internal combustion engine 1.

The ECU 10 controls a driving state of the engine 1. A plastic resin housing forming the air cleaner 2 integrally includes a casing 11 facing to an intake air passage 2a, and the ECU 10 is installed in the casing 11. Miscellaneous sensor signals are input into the ECU 10 to calculate an intake air amount and a fuel supply amount for the engine 1. The ECU 10 controls the opening of a throttle valve 6 and fuel injection amount of an injector 7 based on the calculated intake air amount and fuel supply amount. The intake module further includes an intake duct 3, air-flow meter 5, a throttle body (not illustrated), and an intake manifold 4. The air-flow meter 5 detects an intake air amount. The throttle body contains an open/close mechanism of the throttle valve 6. The intake manifold 4 connects with an intake port of the engine 1, and contains the injector 7.

Figure 2A:
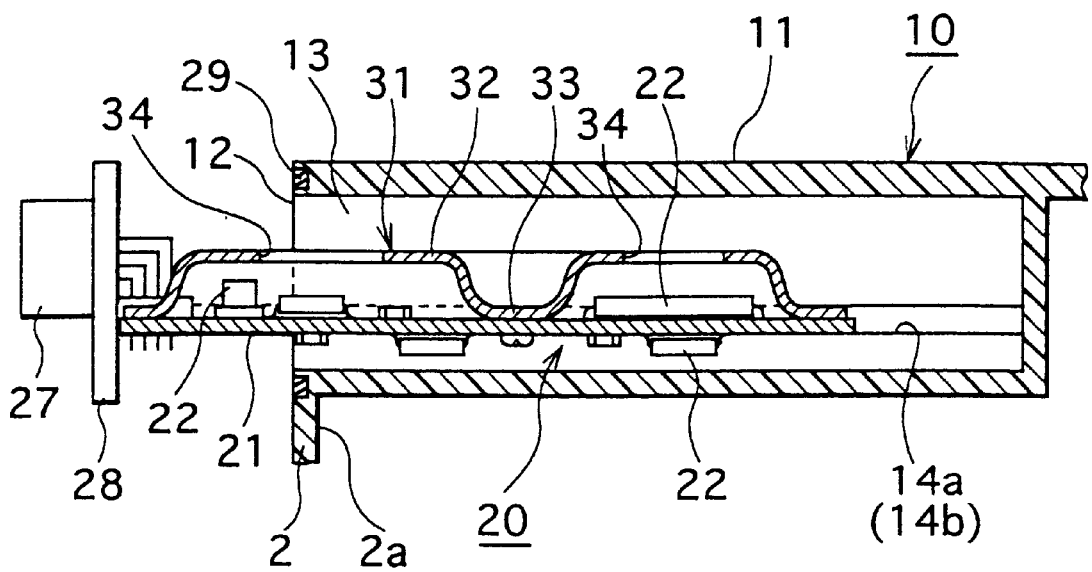
FIG. 2A is a cross-sectional view showing an intermediate state of assembling the ECU (first embodiment)
Figure 2B:
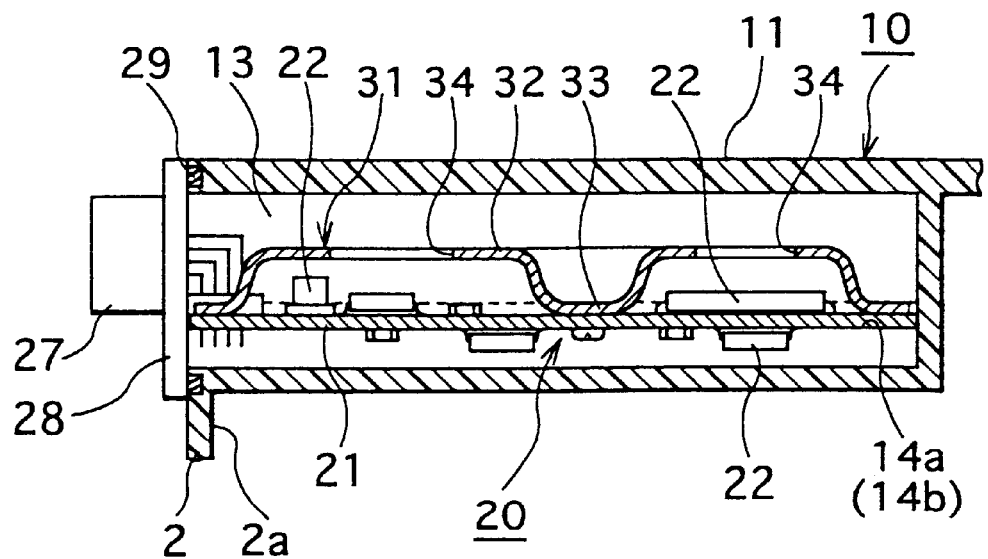
FIG. 2B is a cross-sectional view showing a completed state of assembling the ECU (first embodiment)

FIGS. 2A and 2B are cross-sectional views showing principal parts of the ECU 10. FIG. 2A shows an intermediate state of assembling the ECU 10, and FIG. 2B shows a completed state thereof. FIG. 3 is a perspective view showing the casing 11 and an electronic control circuit 20 installed in the casing 11.

As shown in FIGS. 2A, 2B and 3, the ECU 10 includes the casing 11, a printed-circuit board 21 installed in the casing 11, and a metal plate 31. A plurality of electronic devices 22 forming the electronic control circuit 20 are mounted on the printed-circuit board 21. The metal plate 31 is made of aluminum or steel having high heat conductivity, and screwed to the printed-circuit board 21.

The casing 11 of the ECU 10 includes an opening 12 at the housing front end of the air cleaner 2. The inner wall 13 of the casing 11 includes a pair of slits 14a and 14b facing to each other. The electronic devices 22 such as SMD (Surface Mounted Devices) including IC, tip-condenser, and the like, and high height VMD (Vertical Mounted Devices) including condenser, resister, and the like are mounted on the printed-circuit board 21 to form the electronic control circuit 20. An outside connector 27 is fixed to the casing 11 in such a manner that the terminal thereof is soldered the board 21.

The printed-circuit board 21 and the metal plate 31 are inserted into the casing 11 along the slits 14a, 14b. At rear ends area of the slits 14a and 14b, the width of the slits 14a and 14b is set the same as the rear end area thickness of the printed-circuit board 21 and the metal plate 31. Thus, the printed-circuit board 21 and the metal plate 31 are fixed by the slits 14a, 14b at the rear end area thereof. When the printed-circuit board 21 is completely inserted into the casing 11, a flange 28 of the outside connector 27 covers the opening 12 while providing a seal member 29 therebetween, and is screwed to the casing 11 to seal the inside of the casing 11.

The metal plate 31 is fixed to the upper side of the printed-circuit board 21. That is, the metal plate 31 is fixed to the printed-circuit board 21 at the side where the outside connector 27 is soldered to the board 21. The metal plate 31 includes press-formed convexes 32 for appropriately containing the electronic devices 22 therein. Further, the metal plate 31 includes a concaved contacting portion 33 at the center thereof for being screwed to the printed-circuit board 21. The concaved contacting portion 33 is provided in such a manner that it does not directly interfere with the electronic devices 22 and wire patterns, so that the concaved contacting portion 33 does not worsen a mount efficiency of the printed-circuit board 21. The convexes 32 include a plurality of holes 34 for promoting heat radiation from the inside thereof, and for lightening the metal plate 31.

The metal plate 31 is formed by pressing and bending an aluminum or steel plate, and is connected to the print-circuit board 21 at the minimum necessary area not to influence the mount efficiency of the electronic parts 22. Especially, the concaved contacting portion 33 is formed by pressing and bending, because general squeezing needs a large connection area. Further, some parts of the metal plate 31 are gouged out for lightening.

Figure 4:
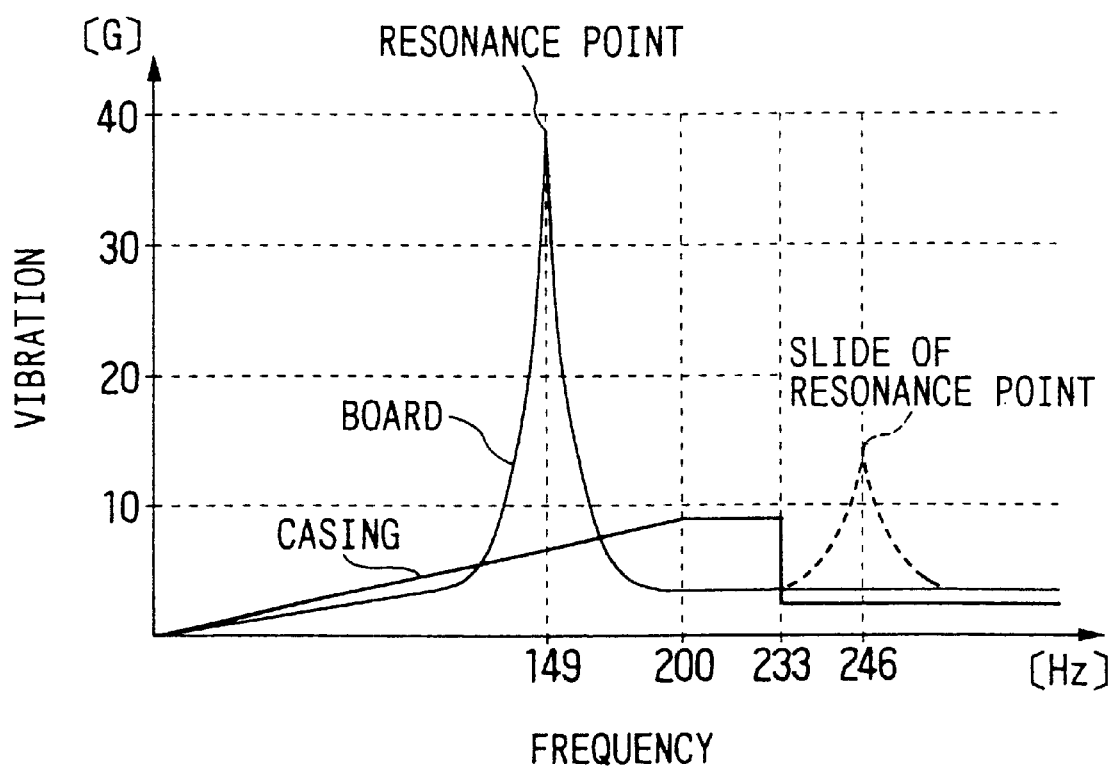
FIG. 4 is a graph showing effects in the ECU (first embodiment)

Effects of the metal plate 31 of the above-described ECU 10 will be explained with reference to FIG. 4. FIG. 4 explains a slide of resonance point of the printed-circuit board 21.

As shown in FIG. 4, as engine rotation number [rpm] increases, the vibration frequency [Hz] and vibration [G: Gravity] of the casing 11 gradually increase. When the rotation number is within 6000–6990 [rpm], the frequency is within 200–233 [Hz], and the vibration is about 9 [G]. When the printed-circuit board 21 resonates, the printed-circuit board 21 vibrates ten times as large as the casing 11.

As described above, as the engine rotation number increases, the vibration frequency of the casing 11 increases. However, when the engine rotation number exceeds 7000 [rpm], a limiter works to shut off a fuel supply. Thus, when the engine rotation number exceeds 7000 [rpm], the vibration of the casing 11 is reduced to about 3 [G] (about ⅓ of maximum vibration).

Therefore, the resonance point of the printed-circuit board 21 is designed over 233 [Hz], and the vibration of the printed-circuit board 21 is made about ⅓ in comparison with a board 21 of which resonance point is within 200–233 [Hz]. In this way, the vibration of the printed-circuit board 21 is suppressed.

According to researches and experiments, inventors of the present invention made sure that the resonance point slides from 149 [Hz] denoted by slid line in FIG. 4 to 246 [Hz] denoted by broken line in the above-described structure. Here, the printed-circuit board 21 is fixed to the metal plate 31 at the peripheral ends and plural center portions thereof. In more detail, the slits 14a, 14b pinch the peripheral ends of the board 21 and the metal plate 31 to fix the peripheral ends of the printed-circuit board 21 to the metal plate 31. In this way, the electronic devices 22 mounted on the printed-circuit board 21 are protected.

Figure 5A:
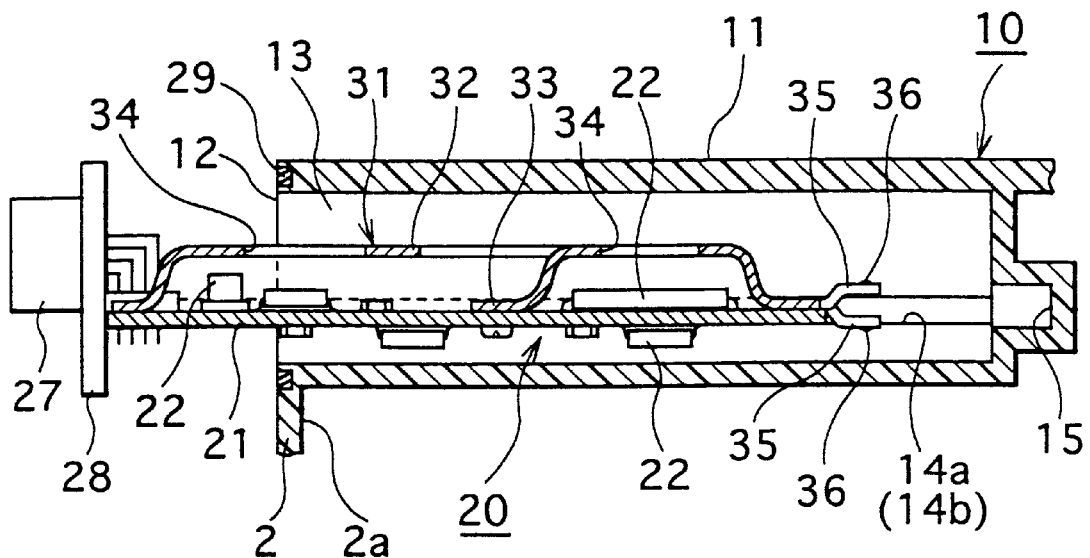
FIG. 5A is a cross-sectional view showing an intermediate state of assembling the ECU (first modification of first embodiment)
Figure 5B:
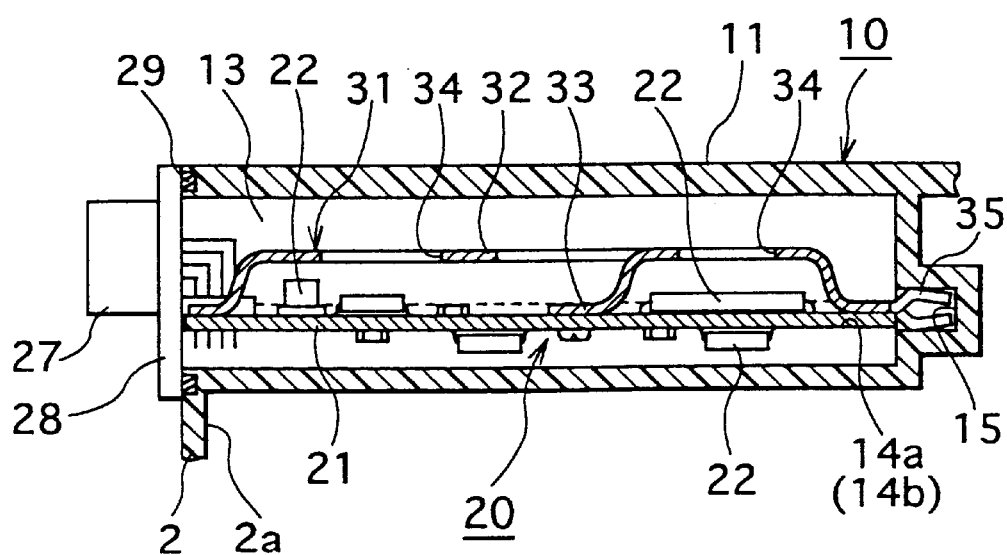
FIG. 5B is a cross-sectional view showing a completed state of assembling the ECU (first modification of first embodiment)
Figure 7A:
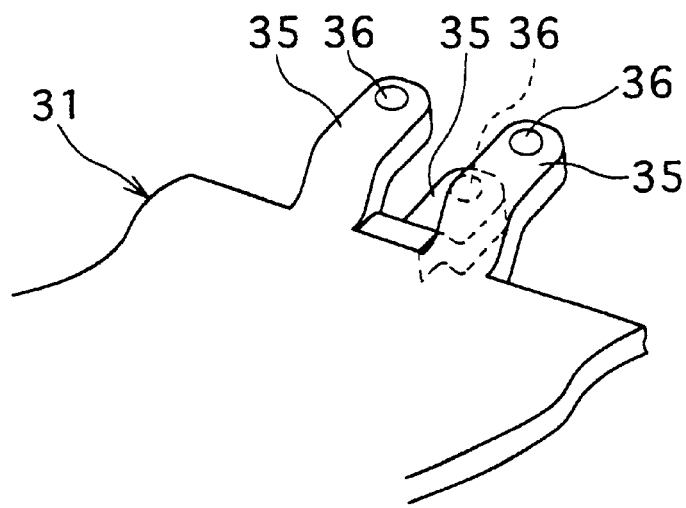
FIG. 7A is an enlarged perspective view showing principal parts of a metal plate (first modification of first embodiment)
Figure 7B:
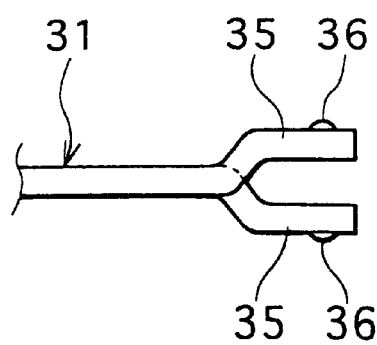
FIG. 7B is an enlarged side view showing principal parts of the metal plate (first modification of first embodiment)

A first modification of the metal plate 31 will be explained with reference to FIGS. 5A, 5B and 6. FIGS. 5A and 5B are cross-sectional views showing the first modification. FIG. 5A shows an intermediate state of assembling the ECU 10, and FIG. 5B shows a completed state thereof. FIG. 6 is a perspective view showing the casing 11 and an electronic control circuit 20 installed in the casing 11. FIGS. 7A and 7B are enlarged views showing P portion in FIG. 6. FIG. 7A is a perspective view, and FIG. 7B is a side view. The metal plate 31 integrally includes a pair of fixing portions 35 at the rear end thereof. As shown in FIG. 7A, the fixing portion 35 has two upper projections and one lower projection therebetween, and has resiliency. As shown in FIGS. 5A and 5B, the casing 11 includes a pocket 15 at the rear thereof, for receiving the fixing portion 35. Each projection of the fixing portion 35 includes a small dimple 36 at their surface to contact the inner wall of the pocket 15.

In this way, the slits 14a and 14b pinch the peripheral ends of the metal plate 31 therebetween, and the fixing portion 35 is inserted into the pocket 15. Thus, the metal plate 31 is firmly fixed to the casing 11. Here, the small dimples 36 assist the fixing portion 35 to be inserted into the pocket 15, and get right into the upper and lower inner walls of the pocket 15 to be firmly fixed.

Figure 8A:
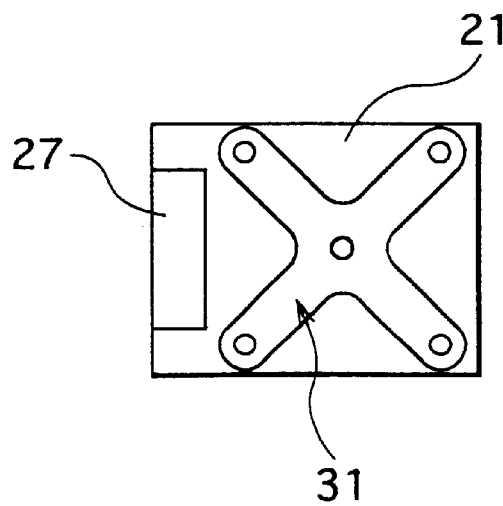
FIGS. 8A and 8B are plan views showing metal plates (second and third modifications of first embodiment)
Figure 8B:
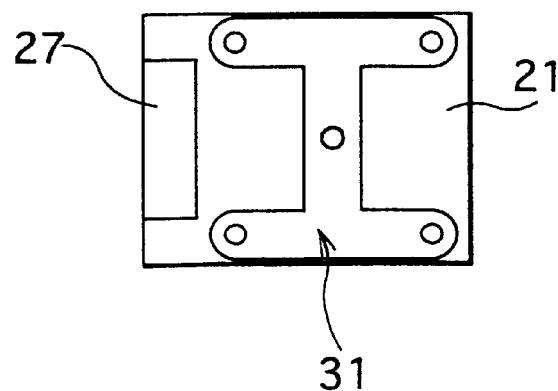

As second and third modifications, the metal plate 31 may be formed in X-shape as shown in FIG. 8A, or may be formed in H-shape as shown in FIG. 8B, to avoid interfering and contacting with the electronic devices 22, and may be fixed to the printed-circuit board 21 by using four points of peripheral end thereof.

As described above, according to the first embodiment, the metal plate 31 is fixed to the printed-circuit board 21 at the concaved contacting portion 33, and the slits 14a and 14b pinch both peripheral ends of the printed-circuit board 21 and the metal plate 31 to further fix the metal plate 31 to the printed-circuit board 21. Thus, even when the engine vibration acts on the intake module including the air cleaner 2, the electronic devices 22 mounted on the printed-circuit board 21 are protected from the vibration.

The casing 11 for the ECU 10 is formed in a part of the air cleaner 2, and is formed in a pocket to face the intake air passage 2a. Thus, the casing 11 is easily formed, has a good heat radiation performance, and is easily sealed.

The metal plate 31 including the convexes 32 and the concaved contacting portion 33 is easily formed by pressing an aluminum or steel plate. Thus, the metal plate 31 is formed with low cost.

The metal plate 31 appropriately includes holes 34, thereby promoting the heat radiation and reducing the weight thereof.

According to the above-described first embodiment, the metal plate 31 includes the convexes 32 for containing the electronic devices 22. The convexes 32 may be made higher to contact the upper inner wall 13 of the casing 11. A contact pressure between the convexes 32 and the upper inner wall 13 is appropriately provided, so that vibration proof of the printed-circuit board 21 increases and the heat radiation performance from the electronic devices 22 is improved. The printed-circuit board 21 is fixed to the metal plate 31 at four or more peripheral end portions, so that anti-stress and anti-vibration performances of the printed-circuit board 21 are improved.

A fourth modification of the first embodiment will be explained with reference to FIGS. 9 and 10.

Figure 9:
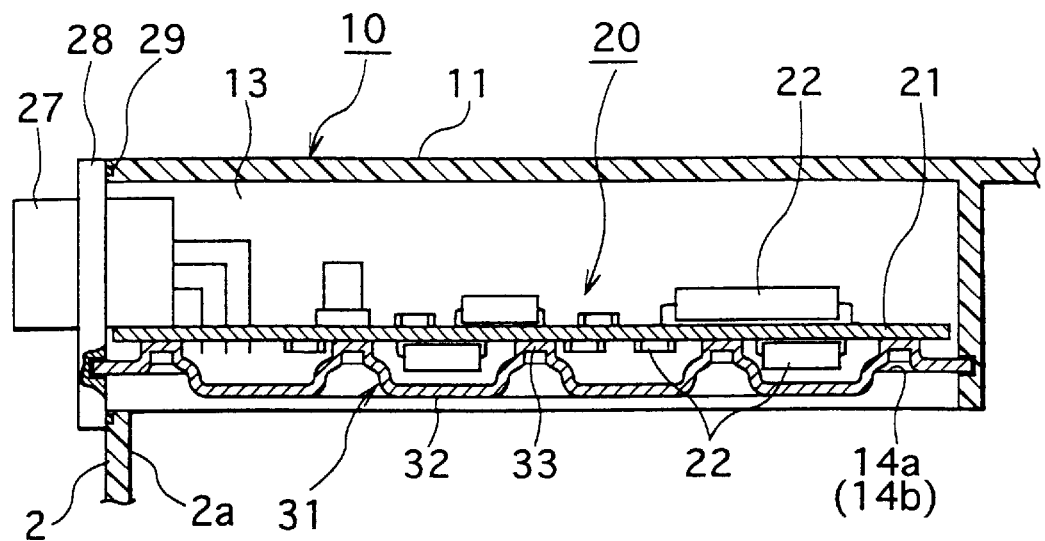
FIG. 9 is a cross-sectional view showing a completed state of assembling the ECU (fourth modification of first embodiment)
Figure 10:
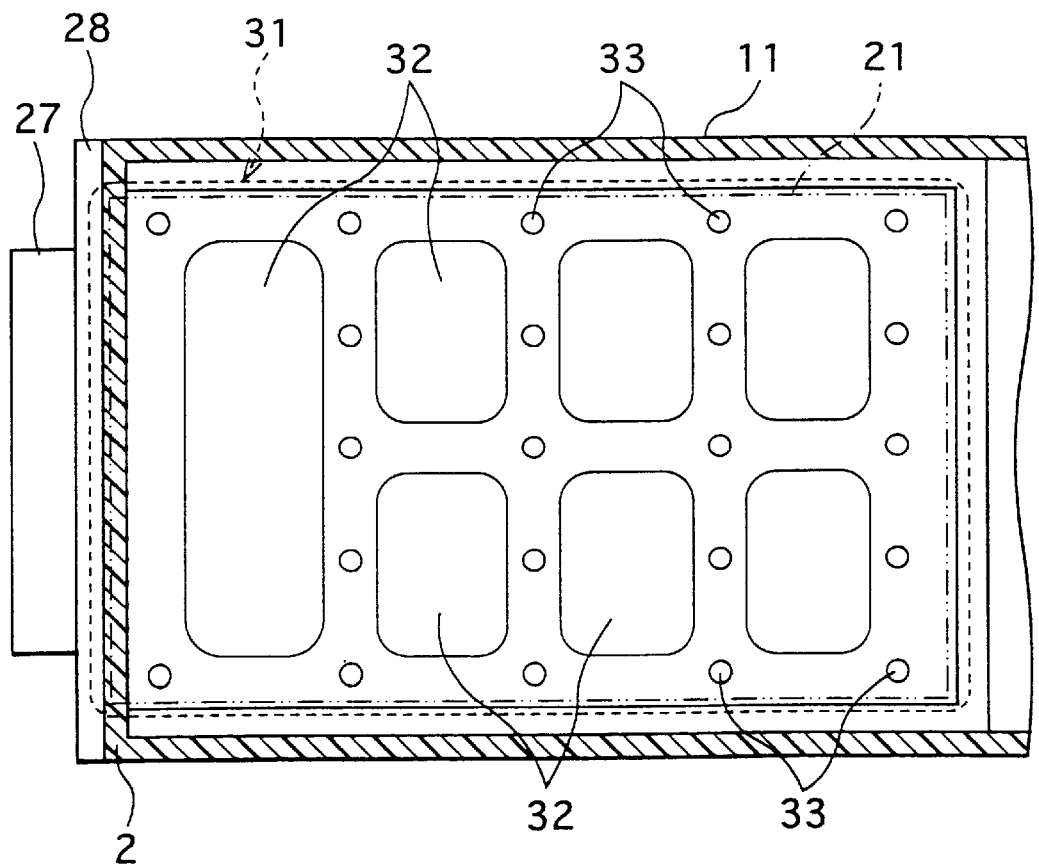
FIG. 10 is a bottom view showing a completed state of assembling the ECU (fourth modification of first embodiment)

As shown in FIGS. 9 and 10, the casing 11 of the ECU 10 is formed in the air cleaner 2, and includes an opening 12. Inside of the casing 11 communicates with the intake air passage 2a at some parts of the inner wall 13. The metal plate 31 is adhered to the lower side (opposite side of outside connector 27) of the printed-circuit board 21 to face the intake air passage 2a. That is, the metal plate 31 partitions the electronic control circuit 20 from the intake air passage 2a.

The metal plate 31 is installed into the casing 11 along the slits 14a, 14b. After the metal plate 31 is completely installed in the casing 11, the flange 28 of the outside connector 27 covers the opening 12 while providing a seal member 29 therebetween, and is screwed to the casing 11. In this way, the inside of the casing 11 is sealed.

According to the fourth modification, the metal plate 31 is adhered and fixed to the printed-circuit board 21, and includes a number of concaved contacting portions 33. The concaved contacting portions 33 are arranged not to interfere with the electronic devices 22 and adhered to the board 21 with small contact areas. Thus, the metal plate 31 does not worsen a mount efficiency of the printed-circuit board 21, and strengthens the connection between the metal plate 31 and the printed-circuit board 21, thereby improving the anti-stress and anti-vibration performance.

In this way, the inside of the casing 11 communicates with the intake air passage 2a, and the metal plate 31 covers the communication portions to partition the electronic control circuit 20 from the intake air passage 2a. Since the metal plate 31 faces to the intake air passage 2a, the intake air to the engine 1 directly contacts with the metal plate 31, thereby promoting the heat radiation from the electronic devices 22.

According to the first embodiment and modifications thereof, the casing 11 is integrally formed in the plastic housing including the air cleaner 2. Alternatively, the casing may be provided independently from the housing, and arranged to face the intake air passage.

According to the first embodiment and modifications thereof, the metal plate 31 is screwed or adhered to the printed-circuit board 21. Alternatively, the metal plate may be mechanically fixed thereto by using a rivet, or fitting structure including a protrusion and a hole corresponding thereto.

Second Embodiment

Figure 11:
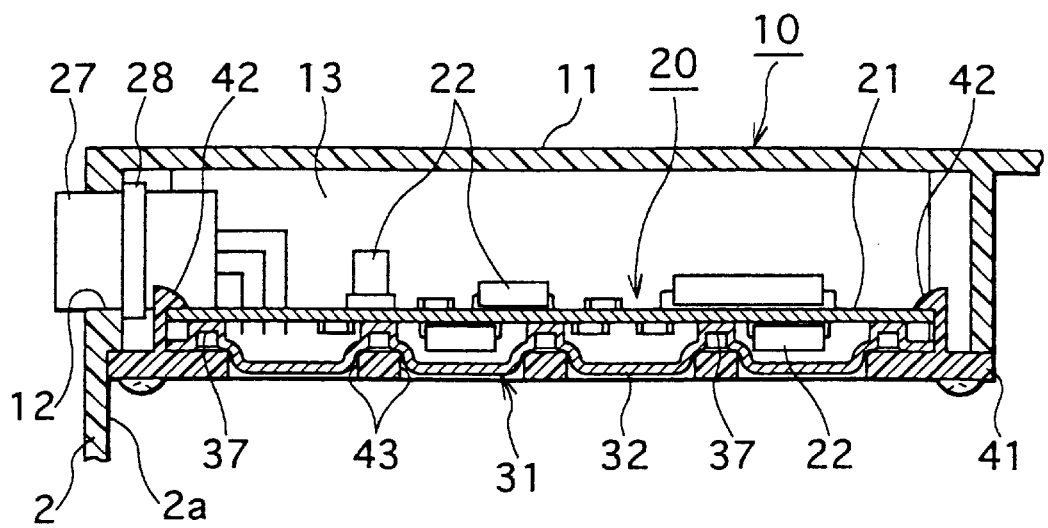
FIG. 11 is a cross-sectional view showing a completed state of assembling the ECU (second embodiment)
Figure 12:
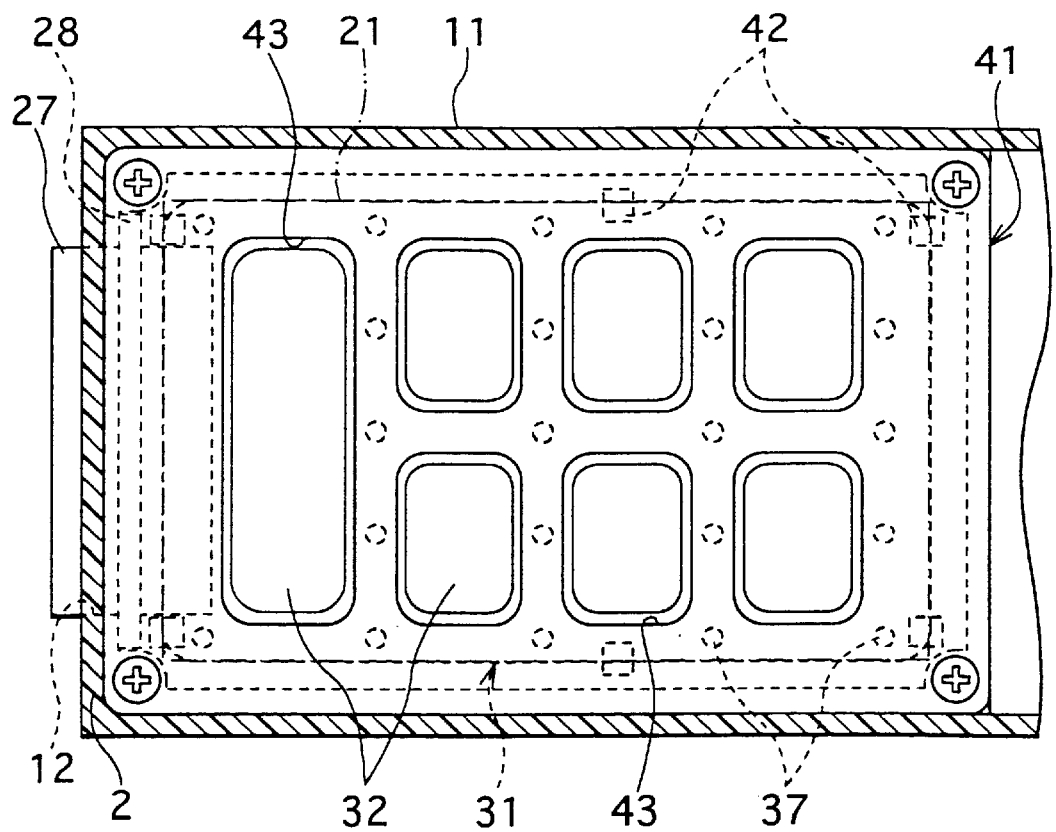
FIG. 12 is a bottom view showing a completed state of assembling the ECU (second embodiment)

In the second embodiment, as shown in FIGS. 11 and 12, a support member 41 is provided. The support member 41 includes a stopper 42 pinching the printed-circuit board 21 and the metal plate 31, and is screwed to the casing 11.

As in the first embodiment, the electronic devices 22 such as SMD and VMD are mounted on the printed-circuit board 21 to form the electronic control circuit 20. The inside of the casing 11 communicates with the intake air passage 2a at some places of the inner wall 13.

The support member 41 including the stopper 42 is screwed to the casing 11 from the side of intake air passage 2a. The outside connector 27 is attached to the opening 12 of the casing 11 from the outside. The flange 28 of the outside connector 27 covers the opening 12 to seal the inside of the casing 11. Further, the support member 41 covers the inner wall of the casing 11 and the intake air passage 2a side.

The metal plate 31 is fixed to the lower side (opposite side of the outside connector 27) of the printed-circuit board 21. The metal plate 31 includes press-formed convexes 32 for containing the electronic devices 22. The support member 41 includes mortised portions 43 at locations corresponding to the convexes 32. Thus, the convexes 32 directly face to the intake air passage 2a. The metal plate 31 further includes contact points 37 contacting the printed-circuit board 21. The contact points 37 are arranged to avoid interfering with the electronic devices 22 and wire patterns not to worsen the mount efficiency of the printed-circuit board 21.

As described above, the support member 41 tightly pinches and supports the printed-circuit board 21 and the metal plate 31. Thus, even when the vibration of the engine 1 acts on the intake module including the air cleaner 2, the printed-circuit board 21 is prevented from resonating.

The inside of the casing 11 communicates with the intake air passage 2a at some locations of the inner wall 13, and the support member 41 and the metal plate 31 cover the communication portions.

The metal plate 31 is easily formed by pressing an aluminum or steel plate and includes the convexes 32 and the contact portions 37 contacting the printed-circuit board 21, so that the weight and manufacturing cost thereof are reduced. Further, since the inside of the casing 11 is easily sealed, water and dust proof performances are improved.

According to the second embodiment, the stopper 42 of the support member 41 tightly pinches the plural peripheral ends of the printed-circuit board 21 and the metal plate 31. Additionally, the contact portions 37 may be adhered to the printed-circuit board 21 to ensure a sealing state at the center area of the printed-circuit board 21 and the metal plate 31, thereby improving the anti-stress and anti-vibration performances, and promoting the heat radiation from the electronic devices 22.

Third Embodiment

Figure 13:
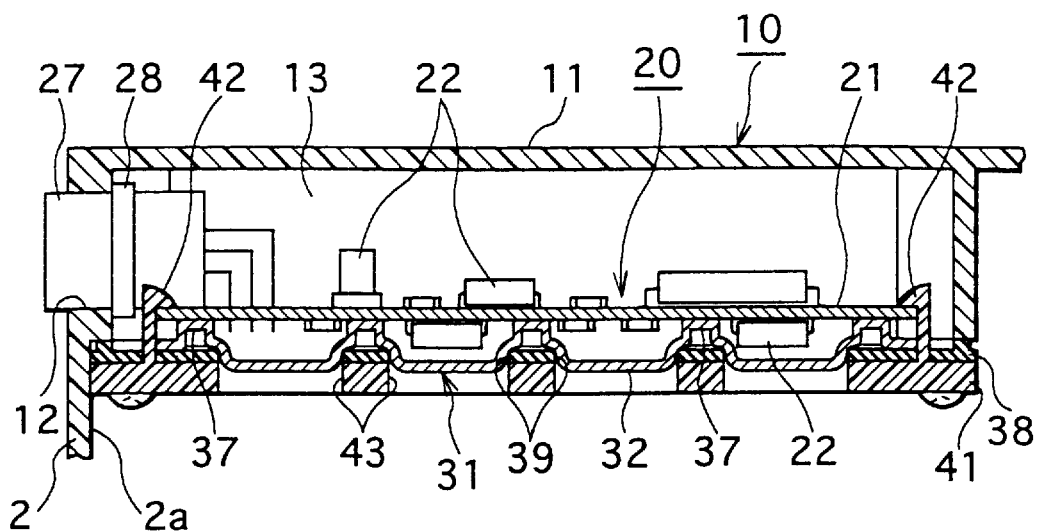
FIG. 13 is a cross-sectional view showing a completed state of assembling the ECU (third embodiment)
Figure 14:
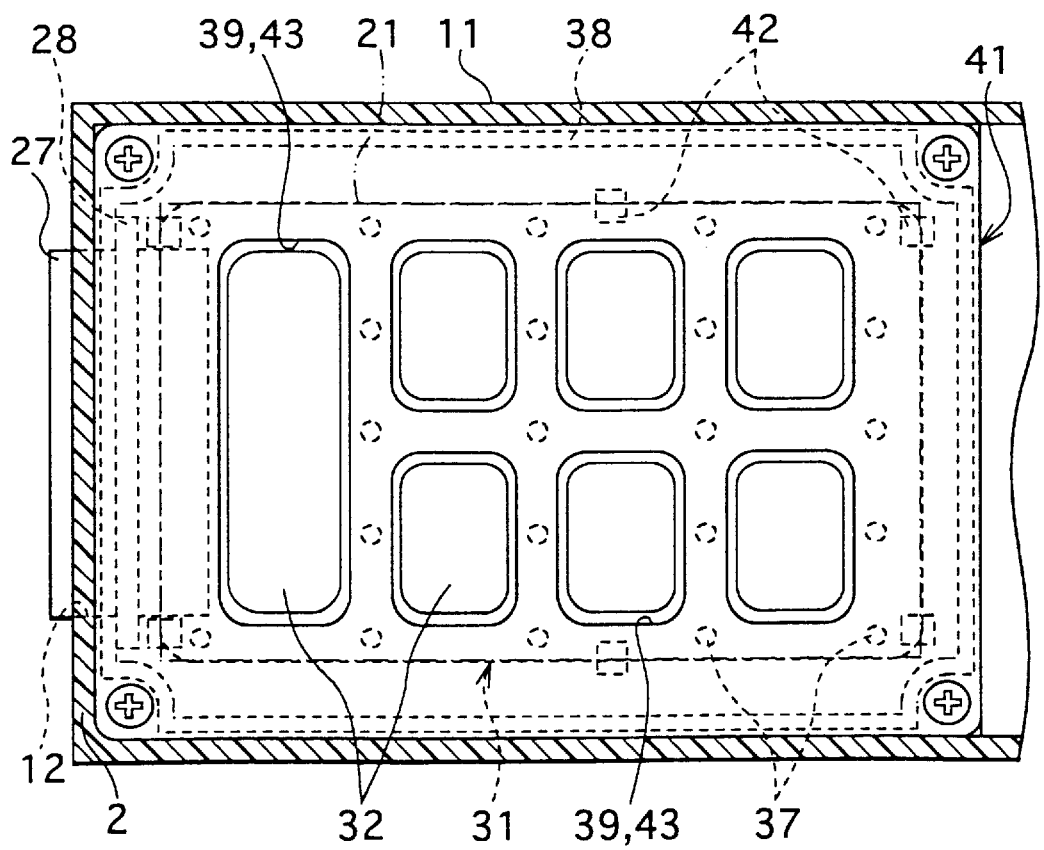
FIG. 14 is a bottom view showing a completed state of assembling the ECU (third embodiment).

In the third embodiment, as shown in FIGS. 13 and 14, an elastic plate 38 is provided between the metal plate 31 and the support member 41. Remaining structures are the same as in the second embodiment. The elastic plate 38 includes mortised portions 39 at locations corresponding to the convexes 32. Further, the metal plate 31 includes mortised portions 43 at locations corresponding to the convexes 32. Thus, the convexes 32 directly face to the intake air passage 2a without being interfered by the elastic plate 38 and the support member 41.

As described above, the support member 41 tightly pinches the printed-circuit board 21 and the metal plate 31 while providing the elastic plate 38 between the metal plate 31 and the support member 41. Thus, even when the vibration of the engine 1 acts on the intake module including the air cleaner 2, the printed-circuit board 21 is suppressed from resonating, thereby preventing the electronic devices 22 from being broken due to the engine vibration. Further, the metal plate 31 with which the elastic plate 38 is provided improves the anti-stress and anti-vibration performance of the printed-circuit board 21.

According to the third embodiment, the stopper 42 of the support member 41 pinches the plural peripheral ends of the printed-circuit board 21 and the metal plate 31 while providing the elastic plate 38, for making the printed-circuit board 21 to contact the metal plate 31 tightly. Additionally, the contact portions 37 may be adhered to the printed-circuit board 21 to ensure a sealing state at the center area of the printed-circuit board 21 and the metal plate 31, thereby improving the anti-stress and vibration performances and promoting the heat radiation from the electronic devices 22.

What is claimed is:

1. An electronic control unit, comprising:
   a printed-circuit board on which a plurality of electronic devices are mounted;
   a metal plate including a convex for containing said electronic devices; and
   a casing for containing said printed-circuit board, wherein said printed-circuit board is fixed to said metal plate at a peripheral end and approximate center portions thereof.

2. An electronic control unit according to claim 1, wherein said casing faces to an intake air passage within an intake module for an internal combustion engine.

3. An electronic control unit according to claim 1, wherein said casing is formed within an intake module for an internal combustion engine.

4. An electronic control unit according to claim 1, wherein said casing includes an opening and is formed in a pocket, said casing includes a pair of slits facing to each other, at an inner wall thereof, and
   at least one of said printed-circuit board and said metal plate is inserted into said casing from said opening along said pair of slits.

5. An electronic control unit according to claim 4, wherein said pair of slits pinch at least one of said printed-circuit board and said metal plate at guide ends thereof.

6. An electronic control unit according to claim 4, wherein,
   an inside of said casing communicates with an intake air passage at some locations of said inner wall, and
   said metal plate covers the some locations of said inner wall.

7. An electronic control unit according to claim 1, wherein said metal plate includes a contact portion to which said printed-circuit board is fixed, and
   said contact portion is arranged not to directly contact said electronic devices.

8. An electronic control unit according to claim 1, wherein said metal plate is fixed to said printed-circuit board at a side where an outside connector is attached to said printed-circuit board.

9. An electronic control unit according to claim 1, wherein said convex includes a hole.

10. An electronic control unit according to claim 1, wherein said convex contacts an inner wall of said casing.

11. An electronic control unit according to claim 1, further comprising a support member tightly pinching said printed-circuit board and said metal plate at plural peripheral ends thereof.

12. An electronic control unit according to claim 11, wherein
    said metal plate includes a contact portion contacting said printed-circuit board, and
    said contact portion is arranged not to directly contact said electronic devices.

13. An electronic control unit according to claim 11, said metal plate is provided on said printed-circuit board at an opposite side of an outside connector.

14. An electronic control unit according to claim 11, said support member includes a mortised portion at a location corresponding to said convex.

15. An electronic control unit according to claim 11, wherein
    said casing faces to an intake air passage within an intake module for an internal combustion engine, and
    said support member is fixed to said casing.

16. An electronic control unit according to claim 15, wherein
    said casing is formed within said intake module,
    an inside of said casing communicates with said intake air passage at some locations at an inner wall thereof, and at least one of said support member and said metal plate covers said some locations.

17. An electronic control unit according to claim 1, further including:
an elastic plate provided on said metal plate at an opposite side of said printed-circuit board; and
a support member tightly pinching said printed-circuit board and said metal plate at plural peripheral ends thereof, while providing said elastic plate between said metal plate and said support member.

18. An electronic control unit according to claim 17, wherein
said metal plate includes a contact portion contacting said printed-circuit board, and
said contact portion is arranged not to directly contact said electronic devices.

19. An electronic control unit according to claim 17, wherein said metal plate is provided on said printed-circuit board at an opposite side of an outside connector.

20. An electronic control unit according to claim 17, wherein said elastic plate includes a mortised portion at a location corresponding to said convex.

21. An electronic control unit according to claim 17, wherein said support member includes a mortised portion at a location corresponding to said convex.

22. An electronic control unit according to claim 17, wherein
said casing faces to an intake air passage within an intake module for an internal combustion engine, and
said support member is fixed to said casing.

23. An electronic control unit according to claim 17, wherein
said casing is formed within said intake module,
an inside of said casing communicates with said intake air passage at some locations at an inner wall thereof, and
at least one of said support member and said metal plate covers said some locations.

24. An electronic control unit according to claim 1, wherein said printed-circuit board is fixed to said metal plate at four or more peripheral end portions.

* * * * *

UNITED STATES PATENT AND TRADEMARK OFFICE
CERTIFICATE OF CORRECTION

PATENT NO. : 6,341,063 B2
DATED : January 22, 2002
INVENTOR(S) : Kinoshita et al.

It is certified that error appears in the above-identified patent and that said Letters Patent is hereby corrected as shown below:

<u>Title page,</u>
Item [30], the priority applications should read as follows:
-- 2000-024624
  2000-029909
  2000-029910
  2000-388900 --

Signed and Sealed this

Twenty-first Day of May, 2002

Attest:

Attesting Officer

JAMES E. ROGAN
Director of the United States Patent and Trademark Office